United States Patent [19]

Voorman

[11] 4,193,033
[45] Mar. 11, 1980

[54] QUADRATURE TRANSPOSITION STAGE

[75] Inventor: Johannes O. Voorman, Eindhoven, Netherlands

[73] Assignee: U.S. Philips Corporation, New York, N.Y.

[21] Appl. No.: 900,918

[22] Filed: Apr. 28, 1978

[30] Foreign Application Priority Data

May 20, 1977 [NL] Netherlands .......................... 7705552

[51] Int. Cl.² ............................................. H04L 27/14
[52] U.S. Cl. ....................................... 375/88; 333/215
[58] Field of Search ................... 325/320, 349; 178/66; 333/80 R, 80 T

[56] References Cited

U.S. PATENT DOCUMENTS

| | | | |
|---|---|---|---|
| 3,568,067 | 3/1971 | Williford | 325/320 |
| 3,644,851 | 2/1972 | Daniels | 333/80 R |
| 3,713,050 | 1/1973 | Golembeski | 333/80 R |
| 3,824,496 | 7/1974 | Hekimian | 333/80 R |
| 3,828,281 | 8/1974 | Chambers | 333/80 R |
| 3,918,014 | 11/1975 | Voorman | 333/80 R |

*Primary Examiner*—Benedict V. Safourek
*Assistant Examiner*—Michael A. Masinick
*Attorney, Agent, or Firm*—Thomas A. Briody; William J. Srreeter; Edward W. Goodman

[57] ABSTRACT

Quadrature transposition stage has two signal channels, each containing a filter. A gyrator circuit is coupled between the filters. The result is that the two filters have exactly the same transfer function which reduces signal distortion in such circuits as an FSK demodulator.

4 Claims, 13 Drawing Figures

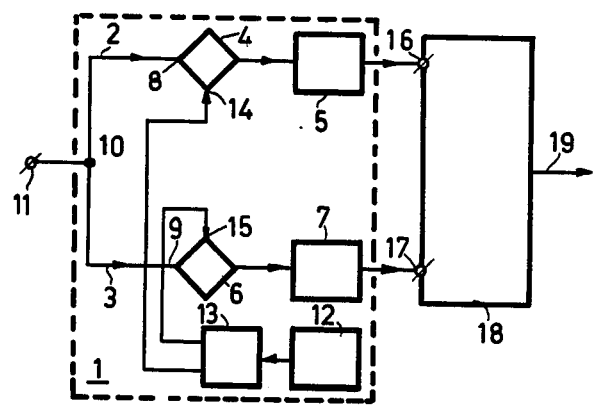
Fig.1
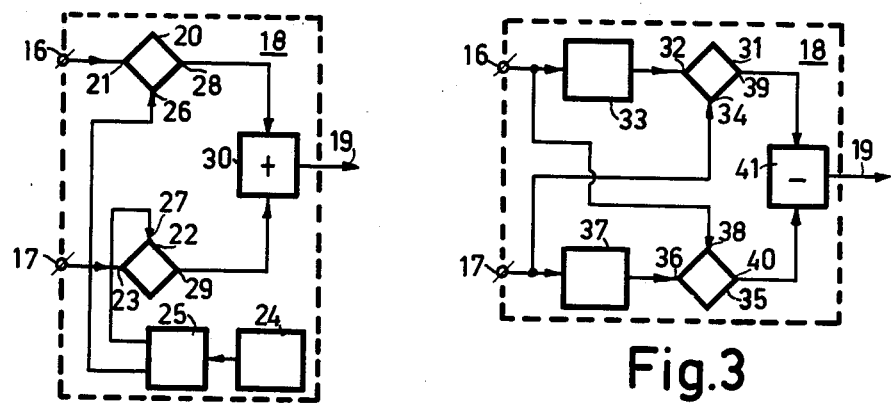
Fig.2
Fig.3
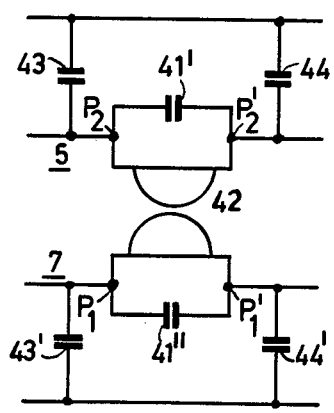
Fig.4

QUADRATURE TRANSPOSITION STAGE

The invention relates to a quadrature transposition stage of a type comprising a first and second signal paths each having a modulator followed by a filter including at least one resonant circuit, an input circuit coupling a first input of each of the modulators to a common input, a local oscillator the output signal of which is applied with such a phase to a second input of each of the modulators that the output signal of the filter in the first signal path is in quadrature with the output signal of the filter in the second signal path, and an output circuit coupling the output of each of the filters to a common output.

A quadrature transposition stage of the above-mentioned type is well-known and is used at the transmitting and/or receiving side of communication systems, for example for the generation and detection of single sideband signals as described, for example, in Proceedings of the IRE, December 1956, pages 1703–1705), or for the detection of FSK signals (as described, for example, in United States Patent Specification No. 3,568,067).

Such a quadrature transposition stage has the drawback that signal distortion can occur due to inequality of the two signal paths. With the exception of the frequency-dependent inequality of the filters used in the two signal paths, which inequality occurs even if the filter components have been selected with very great care, as a result of temperature influences and ageing phenomena, the remaining inequalities can be corrected by simple amplitude and/or phase corrections in one of the signal paths.

It is an object of the invention to provide a quadrature transposition stage of the type mentioned in the preamble wherein the inequality of the two filters is reduced and becomes substantially independent of frequency.

In accordance with the invention a quadrature transposition stage of the type referred to is characterized in that the resonant circuit in each of the two filters is formed by an impedance and an imaginary conductance and in that the imaginary conductances in the respective resonant circuits are introduced by a gyrator having a first port which terminates in the impedance belonging to the resonant circuit of one filter and a second port which terminates in the impedance belonging to the resonant circuit of the other filter.

In a quadrature transposition stage according to the invention the effect of the gyrator coupling between the two filters is that these filters obtain automatically the same poles and substantially the same zero points. The invention is based on the recognition that when there is a voltage $V_L \cos(\omega t - \phi)$ across the impedance belonging to the resonant circuit of one filter, there is a voltage $V_L \sin(\omega t - \phi)$ across the corresponding impedance of the resonant circuit of the other filter and that, consequently, one single gyrator can be used to simulate the two imaginary conductances because, with a gyrator-resonant circuit terminating in both ports with equal impedances there is a voltage of approximately $V \cos(\omega t - \phi)$ at the second port of the gyrator if there is a voltage $V \sin(\omega t - \phi)$ at the first port of the gyrator.

In order that the invention may be more fully understood reference will now be made by way of example to the accompanying drawings in which:

FIG. 1 shows diagrammatically a known quadrature transposition stage;

FIG. 2 shows an embodiment of an output circuit used with the quadrature transposition stage shown in FIG. 1;

FIG. 3 shows another possible embodiment of such an output circuit;

FIGS. 4 and 6 show the principle of the manner in which the filters used in the quadrature transposition stage of FIG. 1 are coupled in accordance with the invention;

Figure 7:
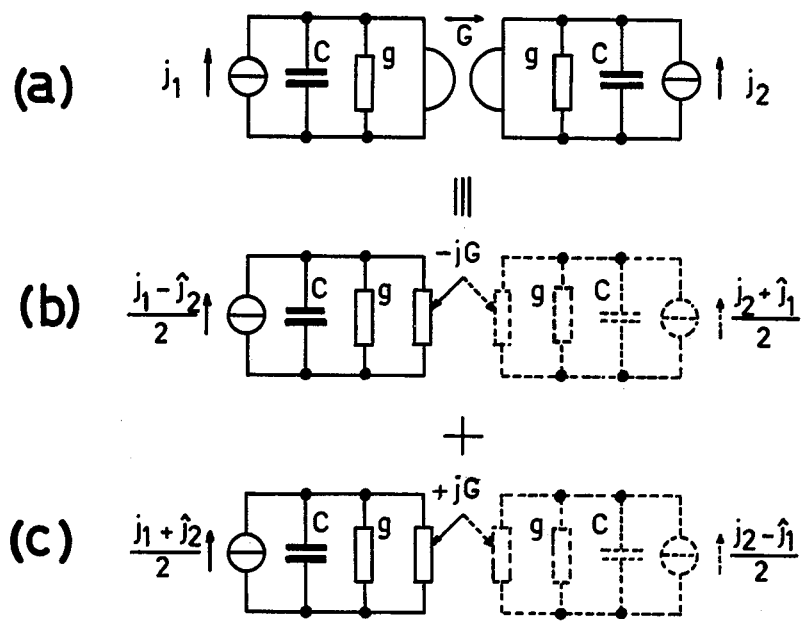
Figure 8:
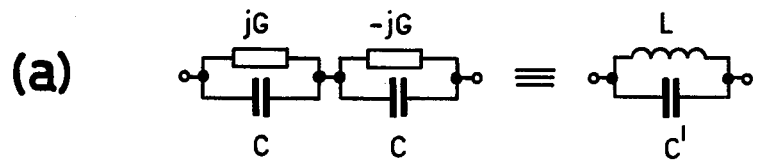
Figure 8:
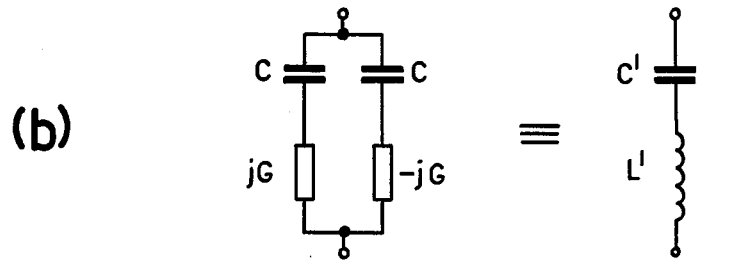
Figure 9:
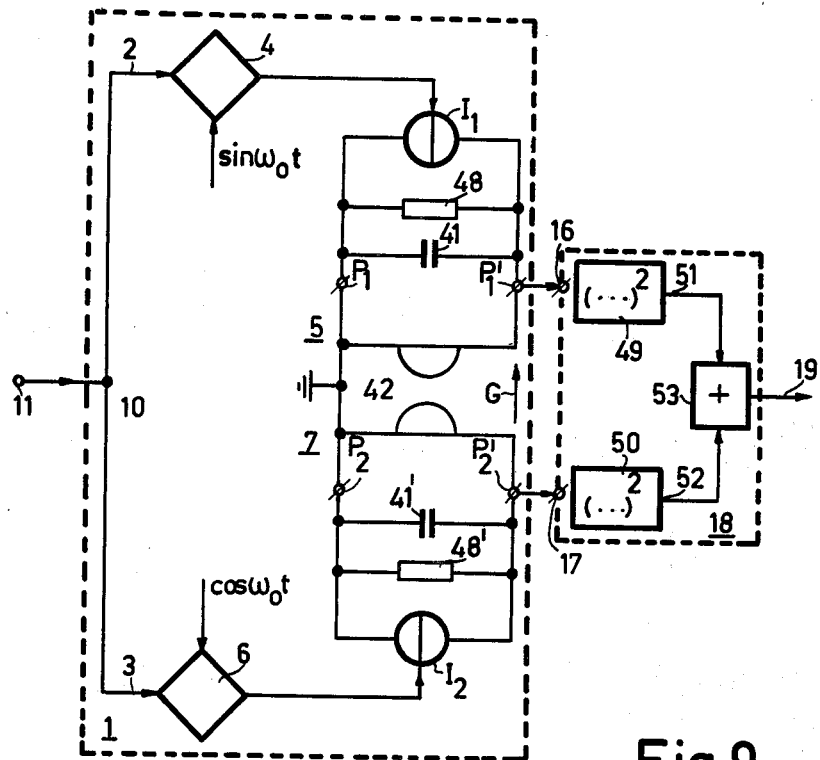
Figure 10:
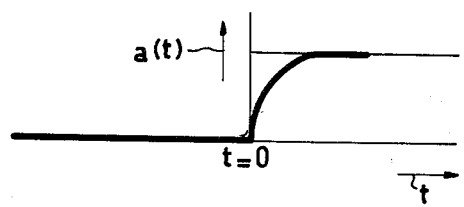
Figure 11:
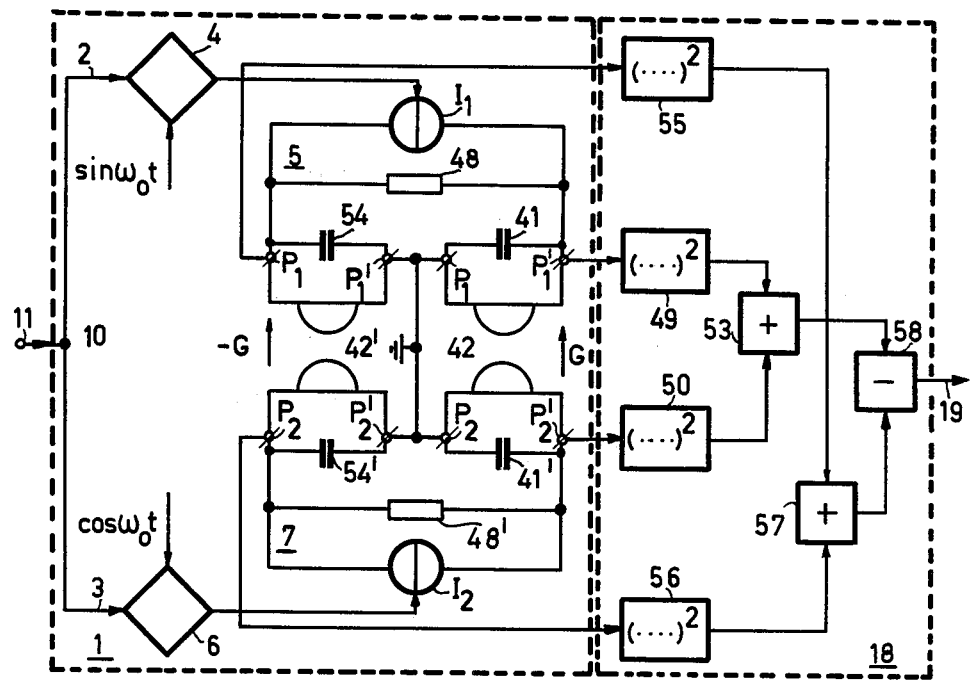

FIG. 7a–c show a number of resonant circuits for explaining multi-coupled filters;

FIG. 8 and FIG. 8b each show a LC-resonant circuit and the equivalent thereof provided with imaginary conductances;

FIG. 9 shows a possible embodiment of an FSK demodulator provided with a quadrature transposition stage according to the invention;

FIG. 10 shows a diagram for explaining the operation of the FSK demodulator shown in FIG. 10; and FIG. 11 shows a possible variation of the FSK demodulator shown in FIG. 9.

Referring to the drawings in FIG. 1 reference 1 represents a quadrature transposition stage comprising first and second signal paths 2 and 3, each having a modulator followed by a filter. The signal path 2 comprises a modulator 4 and a filter 5 provided with at least one resonant circuit, and the signal path 3 comprises a modulator 6 and a filter 7 provided with at least one resonant circuit. The two modulators 4 and 6 are provided with respective first inputs 8 or 9, which are coupled via an input circuit 10 to a common input 11 of the quadrature transposition stage 1. In addition, the quadrature transposition stage 1 comprises a local oscillator 12, whose output signal is applied via a 90° phase-shifting network 13 to respective second inputs 14 and 15 of the modulators 4 and 6. The respective outputs of filters 5 and 7 are connected to respective input terminals 16 and 17 of an output circuit 18 having an output 19 which is common for the two signal paths 2 and 3. The output circuit 18 can be implemented in different ways, depending on the internal application of the circuit. One embodiment of the output circuit 18, shown in FIG. 2, comprises a modulator 20 having a first input 21 connected to the input terminal 16 and a modulator 22 having a first input 23 connected to the input terminal 17. In addition, this output circuit 18 comprises a local oscillator 24, whose output signal is applied via a 90° phase-shifting network 25 to a respective second inputs 26 and 27 of the modulators 20 and 22. The output 28 of modulator 20 and the output 29 of modulator 22 are connected to an adder device 30, the output of which constitutes said common output 19.

If the quadrature transposition stage shown in FIG. 1 is provided with the output stage shown in FIG. 2, this results in a device which is known as a device for the generation or detection of single sideband signals.

For generating a single sideband signal, a base-band signal s(t) of a given bandwidth b is applied the input 11 with possible noise at the higher frequencies. This signal is assumed to be $$s(t) = \sum_{n=1}^{N} E_n \cos(\omega_o t + \phi_n)$$

and is multiplied in one path of the quadrature modulation stage by a frequency signal $\sin(b/2)t$ and in the order path by a frequency signal cos (b/2)t. In the resulting multi-frequency signals, the lower sidebands are located between zero frequency and the frequency b/2. The upper sidebands and the noise occur at frequencies above b/2. The upper sidebands and the noise are suppressed by the filters 5 and 7, which are usually implemented as lowpass filters having a cutoff frequency at b/2. By modulating thereafter by sin ($\omega_c$+b/2)t and cos ($\omega_c$+b/2)t, $\omega_c$ being the carrier frequency, two double-sideband signals are obtained, which have mutually different phase relationships between their sidebands in that one side is in phase and the other is in anti-phase. When these two double-sideband signals are added together the lower sidebands, say, cancel one another and the upper sidebands double.

For demodulation, this method is used in reverse.

The embodiment of the output circuit 18 shown in FIG. 3 comprises a modulator 31 having a first input 32 which is connected via a differentiator 33 to the input terminal 16 and a second input 34 connected to the input terminal 17. This output circuit 18 also comprises a modulator 35 having a first input 36 connected to the input terminal 17 via a differentiator 37 and a second input 38 connected to the input terminal 16. The output 39 of modulator 31 and the output 40 of modulator 35 are connected to a differential amplifier 41, the output of which constitutes the common output 19. If the quadrature transposition stage shown in FIG. 1 is provided with an output circuit shown in FIG. 3, this results in a device which can be used as a frequency discriminator for the detection of frequency-modulated signals or for the detection of signals transmitted by means of frequency-shift keying (FSK) as described in greater detail in the above-mentioned U.S. Pat. Specification No. 3,568,067.

A particularly favourable property of such a quadrature transposition stage is that the filters 5 and 7 do not only effect a separation of the sidebands but also the suppression of neighbouring channels.

However, a drawback which in practice generally makes the use of such a quadrature transposition stage less attractive is that the two paths 2 and 3 require mutual equality for satisfactory operation of the stage. The frequency-dependent inequality of the filters 5 and 7 used in the two paths 2 and 3, is the principle reason that this requirement is difficult to achieve.

The inequality of the two filters 5 and 7 is reduced to a considerable extent and is made substantially frequency-independent if, as shown in FIG. 4, the resonant circuits in the two filters are each constituted by an impedance and an imaginary conductance and if imaginary conductances in the two resonant circuits are introduced by a gyrator 42 having a first port $P_1$-$P'_1$ which terminates in the impedance 41″ belonging to the resonant circuit of the filter 7, and a second port $P_2$-$P'_2$ which terminates in the impedance 41′ belonging to the resonant circuit of the other filter 5.

In the embodiment shown in FIG. 4, the filters 5 and 7 as coupled by means of the gyrator 42, each consist of a $\pi$-network comprising in the series branch the resonant circuit and in the parallel branches the capacitors 43, 44 and 43′, 44′, respectively. More particularly, the resonant circuit of filter 5 comprises the impedance 41′ constituted by a capacitor and the imaginary conductance jG which is simulated by means of the gyrator 42 and the impedance 41″, similarly, the resonant circuit of filter 7 comprises the impedance 41″ constituted by a capacitor and the imaginary conductance jG which is simulated by means of the same gyrator 42 and the impedance 41′.

The gyrator 42 shown symbolically in FIG. 4 in an impedance inverter of a type known per se and may, for example, be constituted by a gyrator of the type described in U.S. Pat. No. 3,921,102.

Figure 5:
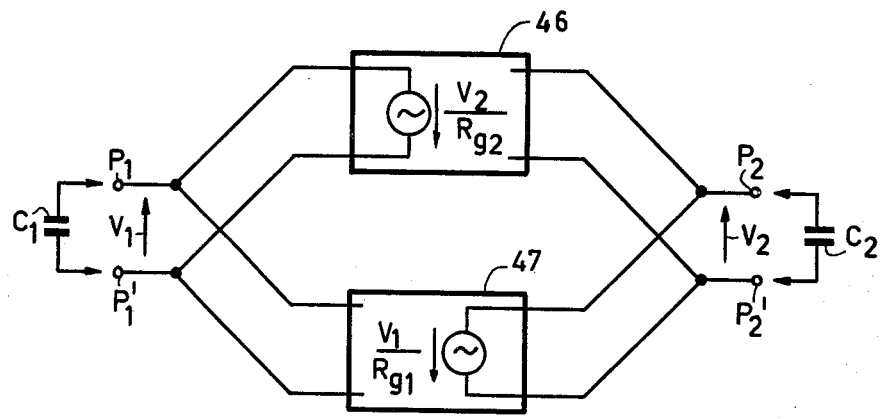
FIG. 5 shows the circuit diagram of a gyrator.

As shown in FIG. 5, such a gyrator is formed essentially by two parallel arranged voltage-controlled current sources 46, 47, one of which has a positive transconductance G and the other a negative transconductance −G, where G=1/$R_g$ and $R_g$=gyration resistance. If a capacitor $C_1$ is connected to the gyrator port $P_1$-$P'_1$ an inductance L is simulated by the gyrator across the port $P_2$-$P'_2$, where L=$R_g^2$ C. With a proper choice of the positive and negative transconductances G and −G, the gyrator ports $P_1$-$P'_1$ and $P_2$-$P'_2$ can be terminated with capacitors $C_1$ and $C_2$ of a mutually equal value, a symmetrical resonant circuit being obtained in this manner. Such a symmetrical resonant circuit has a resonant frequency $\omega_o$=G/C where G=gyrator-transconductance and C=the value of the terminating capacitors. If a sinusoidal input alternating current $i_1$=a cos $\omega$t is applied to such a resonant circuit the voltage has a resonant character as a function of the frequency of the input signal.

It appears that the voltages at the two gyrator ports $P_1$-$P'_1$ and $P_2$-$P'_2$ each have this resonant character. These voltages have equal amplitudes but their phases are shifted 90° with respect to one another. If $i_1$=a cos $\omega$t, then $i_2 \approx$ a sin $\omega$t.

The same quadrature relationship is also present with the input signals of the filters 5 and 7 in FIG. 1. For, assuming that the frequency spectrum of the signal s(t) applied to the input 11 is equal to s(j$\omega$), then the frequency spectrum of the signals applied to the input of the filters 5 and 7 can be written, respectively, as:

$$s_1(j\omega) = \frac{a}{2j} s\{j(\omega - b/2)\} - \frac{a}{2j} s\{j(\omega + b/2)\}$$

and $$s'_1(j\omega) = \frac{a}{2} s\{j(\omega - b/2)\} + \frac{a}{2} s\{j(\omega + b/2)\}$$

from which it appears that the first term of s'$_1$(j$\omega$), is shifted +90° in phase relative to the first term of s$_1$(j$\omega$), whereas the phase of the second term of s'$_1$(j$\omega$), is shifted −90° relative to the second term of s$_1$(j$\omega$).

Utilizing this quadrature phase relationship of the input signals applied to the filters 5 and 7 and the property inherent in a symmetrical gyrator resonant circuit that the voltages occurring at the ports of the gyrator have the same quadrature phase relation-ship, the two filters 5 and 7 can be coupled by means of a gyrator. This coupling between the two filters 5 and 7 makes the poles of the two transfer functions H(j$\omega$) and H'(j$\omega$) of the two filters the same, irrespective of small differences in the value of corresponding components used in the two filters, as these poles correspond to the frequencies of the free oscillations of the network formed by the two filters and the gyrator.

In addition, because of this coupling, the zero points of the two transfer functions H(j$\omega$) and H'(j$\omega$) determined by the series circuits and the parallel circuits of the filters, are substantially equal, irrespective of small differences in the value of the corresponding filter components used.

Figure 6:
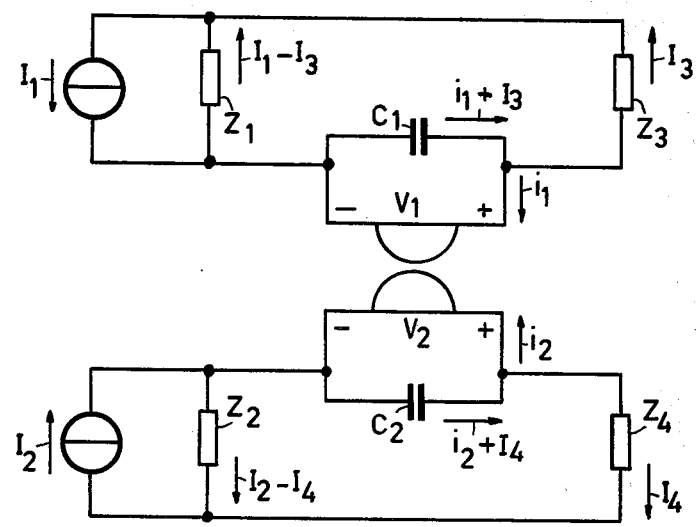

In order to further explain this technical effect which is important for the practical use of the quadrature transposition stage, FIG. 6 shows the network of FIG. 5, with the addition of two current sources $I_1$ and $I_2$, internal impedances $Z_1$ and $Z_2$, respectively, and load impedances $Z_3$ and $Z_4$, respectively.

The equations of a practical gyrator are:

$$i_1 = G_2 v_2$$

$$i_2 = -G_1 v_1 \qquad (1)$$

where $G_1$ and $G_2$ are equal to one another, not taking the customary tolerances into account.

Furthermore, there are the equations:

$$i_1 + I_3 = -v_1 p C_1$$

$$i_2 + I_4 = -v_2 p C_2 \qquad (2)$$

and $$(I_1 - I_3)Z_1 + v_1 = I_3 Z_3$$

$$(I_2 - I_4)Z_2 + v_2 = I_4 Z_4 \qquad (3)$$

Using the above equations to express the current $I_3$ flowing through the load impedance $Z_3$ and the current $I_4$ flowing through the load impedance $Z_4$ (each individually in the currents $I_1$ and $I_2$) it is found to apply for the filter 5 that:

$$I_3 = \frac{I_1 Z_1 \{G_1 G_2 (Z_2 + Z_4) + pC_1 + p^2 C_1 C_2 (Z_2 + Z_4)\} + I_2 G_2 Z_2}{1 + pC_1(Z_1 + Z_3) + pC_2(Z_2 + Z_4) + (G_1 G_2 + p^2 C_1 C_2)(Z_1 + Z_3)(Z_2 Z_4)}$$

and for filter 7 that:

$$I_4 = \frac{I_2 Z_2 \{G_1 G_2 (Z_1 + Z_3) + pC_2 + p^2 C_1 C_2 (Z_1 + Z_3)\} + I_1 G_1 Z_1}{1 + pC_1(Z_1 + Z_3) + pC_2(Z_2 + Z_4) + (G_1 G_2 + p^2 C_1 C_2)(Z_1 + Z_3)(Z_2 Z_4)}$$

From this it appears that it holds for amounts $I_3$ and $I_4$ that they have automatically the same denominator N and, consequently, the same poles.

It furthermore holds that:

$$N \frac{I_3}{I_1} - N \frac{I_4}{I_2} = Z_1 \left( pC_1 + G_1 \frac{I_3}{I_4} \right) - Z_2 \left( pC_2 - G_2 \frac{I_4}{I_3} \right) + (Z_1 Z_4 - Z_2 Z_3)(G_1 G_2 + p^2 C_1 C_2).$$

The difference appears to be small for all frequencies, even with the steep portions of the filter curves as they occur near the zero points of the transfer functions.

In the above it is assumed for simplicity that the filters 5 and 7 each consist of one single $\pi$-network. It appears, however, that each of the filters can be assembled from several filter sections each comprising a resonant circuit and that, in that case, corresponding sections of the two filters can be coupled pair-wise by means of a gyrator, as will now be explained in greater detail.

Consider for this purpose the resonant circuit shown in FIG. 7a, this resonant circuit has two input signals $$j_1(t) = ReJ_1 e^{j\omega t}$$

and $$j_2(t) = ReJ_2 e^{j\omega t}$$

Writing: $\hat{j}_1(t) = ImJ_1 e^{j\omega t}$ and $\hat{j}_2(t) = ImJ_2 e^{j\omega t}$, then $j_1(t)$ can be written as the sum $$j_1(t) = \frac{j_1 - \hat{j}_2}{2} + \frac{j_1 + \hat{j}_2}{2}$$

and also $$j_2(t) = \frac{j_2 + \hat{j}_1}{2} + \frac{j_2 - \hat{j}_1}{2}$$

These equations prove that the input signals $j_1(t)$ and $j_2(t)$ can each be divided into two parts. The first part of $j_1(t)$ can be written:

$$\frac{\hat{j}_1 - \hat{j}_2}{2} = \frac{ReJ_1 e^{j\omega t} - ImJ_2 e^{j\omega t}}{2}$$

$$= \frac{1}{2} Re(J_1 + jJ_2) e^{j\omega t}$$

and the first part of $j_2(t)$ can be written:

$$\frac{j_2 + \hat{j}_1}{2} = \frac{ReJ_2 e^{j\omega t} + ImJ_1 e^{j\omega t}}{2}$$

$$= \frac{1}{2} Re - j(J_1 + jJ_2) e^{j\omega t}$$

From this it appears, as shown in FIG. 7b, that for the first parts an imaginary conductance $-jG$ is seen in the gyrator ports. It can be proved in a corresponding manner that, as shown in FIG. 7c, an imaginary conductance $+jG$ is seen in the gyrator ports for the second parts. From this it follows that as regards the synthesis of coupled filters, only one half of the network need be considered. The gyrators forming the connection between the two identical network halves can be replaced by imaginary conductances. The imaginary conductances introduced in successive filter sections by means of gyrators can have mutually different values. This enables the realisation of filters having a filter curve which is asymmetrical relative to the $\omega_o$-frequency axis. Alternatively, it is possible to realise the equivalent of an LC circuit by means of the imaginary conductances introduced by means of two gyrators.

Thus, FIG. 8a shows the equivalent of a parallel resonant circuit consisting of an inductance L' and a capacitance C', whereas FIG. 8b shows the equivalent of a series resonant circuit consisting of an inductance L' and a capacitance C'. In view of these equivalences it is therefore possible to couple corresponding LC resonant circuits of any pair of filters without further computation.

The coupling, realised by means of a gyrator, between the two filters of a quadrature transposition stage as described above, does not only have the important advantage that the frequency-dependent inequality of the two filters is reduced to a very high degree, but it also results, when using a quadrature transposition stage which is part of an FSK-demodulator, in a considerable simplification of the output circuit.

FIG. 9 shows such a FSK demodulator comprising a quadrature transposition stage. As in FIG. 1, the quadrature transposition stage 1 comprises a first and a second signal path 2, 3, connected to a common input 11 and each provided with a respective modulator 4 and 6 followed by a respective filter 5 and 7. The two filters are coupled by means of a gyrator 42 whose ports $P_1-P'_1$ and $P_2-P'_2$ each terminate in an impedance 41', 41'', constituted by a capacitor, and a resistor 48, 48'. The gyrator is fed by the controlled current sources $I_1$ and $I_2$ which are connected to the ports $P_1-P'_1$ and $P_2-P'_2$. The two filter outputs are connected to an output circuit 18 which in the embodiment of the FSK-demodulator shown comprises a first and second squaring devices 49 and 50 connected, respectively, to the inputs 16 and 17 of the output circuit 18. The outputs 51 and 52 of the squaring devices 49 and 50 are connected to an adding device 53 having a common output 19.

The FSK-demodulator operates as follows: It is assumed that a signal transmitted by means of frequency-shift keying (FSK) is applied to the input 11 and that this signal has a binary code wherein, for example, the lower frequency $\omega_o - \Delta\omega$ is representative of the "zeroes" and the higher frequency $\omega_o + \Delta\omega$ is representative of the "ones".

Let us now consider a signal transition at $t=0$. The input signal is:

$$\sin\{(\omega_o - \Delta\omega)t + \phi\} \text{ for } t < 0$$

and $$\sin\{(\omega_o + \Delta\omega)t + \phi\} \text{ for } t > 0$$

At $t=0$ the phase is continuous.

The input signal is applied to the modulators 4 and 6 and demodulated with $\sin \omega_o t$ in modulator 4 and with $\cos \omega_o t$ in modulator 6, $\omega_o$ being the carrier frequency. The phases of the low frequency portions of the demodulated signals are shifted 90° relative to one another. The phase difference changes sign at $t=0$. Thus the output signal of modulator 4 is equal to:

$$-\sin(\Delta\omega t - \phi) + \ldots \text{ for } t < 0$$

and $$+\sin(\Delta\omega t + \phi) + \ldots \text{ for } t > 0$$

whereas the output signal of modulator 6 is equal to:
$$+\cos(\Delta\omega t - \phi) + \ldots \text{ for } t < 0$$
and
$$+\cos(\Delta\omega t + \phi) + \ldots \text{ for } t > 0$$

The demodulated signals are applied as input signals to the filters 5 and 7 which form together with the gyrator 42 a symmetrical gyrator resonant circuit having a resonant frequency $G/C = \Delta\omega$.

For $t > 0$ the quadrature relationship of the two input signal currents conforms to the sine and cosine signals such as they normally occur at the two ports $P_1-P'_1$ and $P_2-P'_2$. The two signal currents give the same response. The two responses add up. The filters behave as an adaptive filter for the "ones". For $t < 0$ the sign of one of the input signal currents is inverted and the two responses do not add up, but result in the difference. In the output circuit 18 each of the voltage occurring at the gyrator port $P_1-P'_1$ and at the gyrator port $P_2-P'_2$ are squared and thereafter added in the adder device 53. The sum signal occurring at the output 19 of the adder device 53 has a low amplitude for $t < 0$ and increases for $t > 0$. FIG. 10 shows this variation of the output voltage amplitude a(t). The signal occurring at the output 19 is a replica of the binary code transmitted by means of the FSK signal and can be derived from this output signal, for example via a threshold device (not shown). As the high-frequency portions of the input signals applied to the filters 5 and 7 fall outside the passband these high-frequency portions are suppressed by the gyrator resonant circuit.

It will be obvious that if the gyrator 42 is connected so that the gyrator transconductance is $-G$ instead of $G$ the filters form together with the gyrator an adaptive filter for the "zeroes" instead of the "ones".

FIG. 11 shows a quadrature transposition stage 1 comprising a FSK demodulator, which differs from the embodiment shown in FIG. 9 in that the filters 5 and 7 are coupled by means of two gyrators 42 and 42' having opposite gyrator transconductances G and $-G$, respectively, so that the filters together with the gyrators form an adaptive filter for both the "ones and the zeroes" of the transmitted binary code.

Each of the ports $P_1-P'_1$ and $P_2-P'_2$ of the gyrator 42 terminates in an impedance 41', 41'', formed by a capacitor, and each of the ports $P_1-P'_1$ and $P_2-P'_2$ of the gyrator 42' terminates in an impedance 54, 54' formed by a capacitor. The port terminal $P'_1$ of gyrator 42' and the port terminal $P_1$ of gyrator 42 are interconnected and connected to ground, and the port terminal $P'_2$ of gyrator 42' and the port terminal $P_2$ of gyrator 42 are also interconnected and connected to ground. The two gyrators are supplied from the controlled current sources $I_1$ and $I_2$, the controlled current source $I_1$ being connected to the port terminal $P_1$ of gyrator 42' and to the port terminal $P'_1$ of gyrator 42, and the controlled current source $I_2$ being connected to the port terminal $P_2$ of gyrator 42' and to the port terminal $P'_2$ of gyrator 42.

With this method of connection the gyrator-transconductance of gyrator 42' is equal to $-G$ whereas the gyrator-transconductance of gyrator 42 is equal to $+G$.

In this embodiment the output circuit 18 comprises a first pair of squaring devices 49 and 50 the outputs of which are connected to an adder 53 and a second pair of squaring devices 55 and 56 the outputs of which are connected to an adder 57. The outputs of the adders 53 and 57 are connected to a difference producer, the output of which constitutes the common output 19 of the output circuit 18.

In this embodiment of the FSK-demodulator, not only the voltages at the ports $P_1-P'_1$ and $P_2-P'_2$ of gyrator 52 are squared in the squaring devices 49 and 50, respectively, and thereafter added in the adder 53, but also the voltages at the ports $P_1-P'_1$ and $P_2-P'_2$ of gyrator 42' are squared in the squaring devices 55 and 56, respectively, and thereafter added in the adder 57. Owing to the fact that the gyrators 42 and 42' have an opposite transconductance, the signal occurring at the output of the adder 53 has a low amplitude for $t < 0$ and a high amplitude for $t > 0$, whereas, on the contrary, the signal occurring simultaneously at the output of the adder 57 has a high amplitude for $t < 0$ and a low amplitude for t>0. The difference producer 58 is, for example, a differential amplifier. If now the output signal of adder 53 is applied to the non-inverting input and the output signal of the adder 57 to the inverting input this differential amplifier supplies an output signal which is a replica of the originally transmitted binary code.

With the FSK-demodulator shown in FIG. 11, the bit length is substantially constant and wideband-noise is suppressed. Therefore, even when an input filter is omitted, a good signal/noise ratio results. In addition, no threshold device is required for recovering the originally transmitted binary code, which is advantageous with a monolythically implemented FSK-modulator as shown in FIG. 11.

What is claimed is:

1. A quadrature transposition stage comprising first and second signal paths, each path having a modulator, a filter coupled to said modulator, said filter including at least a first resonant circuit and an output; an input means for coupling a first input of each of the modulators to a common input, a local oscillator means for producing an output signal, means for applying the output signal of said local oscillator with a selected phase to a second input of each of the modulators so that the output signal of the filter in the first signal path is in quadrature with the output signal of the filter in the second signal path, and an output circuit coupling the output of each of the filters to a common output, the resonant circuit in each of the two filters comprising an impedance element and an imaginary conductance, and first gyrator means for providing the imaginary conductances in the respective resonant circuits, said gyrator means having a first port which terminates in the impedance element belonging to the resonant circuit of one filter and a second port which terminates in the impedance element belonging to the resonant circuit of the other filter.

2. A quadrature transposition stage as claimed in claim 1, wherein the filter included in the first signal path and the filter included in the second signal path each further comprise a second resonant circuit, each of the first resonant circuits impedance element comprising a capacitive impedance element and said imaginary conductance comprising a positive imaginary conductance, each of the second resonant circuits comprising a capacitive impedance element and a negative imaginary conductance, said first gyrator means providing said positive imaginary conductances in said first resonant circuits, and having respective ports which terminate in the capacitive impedance elements of the first resonant circuits, and further comprising second gyrator means for providing said negative imaginary conductances in said second resonant circuits and having respective ports which terminate in the capacitive impedance elements of said second resonant circuits.

3. A quadrature transposition stage as claimed in claim 2, wherein the resonant frequency + of one resonant circuit corresponding to the positive frequency shift and the resonant frequency − of the other resonant circuit corresponding to the negative frequency shift of an FSK-signal demodulated by means of modulators preceding the filters, and said the output circuit comprises a first pair of squaring device means for squaring the voltages appearing at the first and second ports of the first gyrator respectively, and a second pair of squaring device means for squaring the voltages occurring at the first and second ports of the second gyrator respectively, a first adding device connected to the outputs of the first pair of squaring device means, a second adding device connected to the outputs of the second pair of squaring device means, and a difference producer means connected to the outputs of the first and second adding circuits for recovering the original binary code transmitted by means of frequency shift keying.

4. A quadrature transposition stage as claimed in claim 1, wherein said resonant circuits have a resonant frequency which corresponds to the frequency shift of an FSK-signal which is demodulated by means of the modulators preceding the filters, and the output circuit comprises a first and second squaring device means for squaring the voltages appearing at the first and second ports of the gyrator respectively, and an adding device means connected to the outputs of the first and second squaring device means for determining the sum of the squared signals and for recovering the original binary code which is transmitted by means of frequency shift-keying.

* * * * *